Oct. 5, 1965 T. C. T. NEW 3,210,563

FOUR-LAYER SEMICONDUCTOR SWITCH WITH PARTICULAR CONFIGURATION EXHIBITING RELATIVELY HIGH TURN-OFF GAIN

Filed Oct. 6, 1961

3 Sheets-Sheet 1

WITNESSES

Edwin E. Bassler

Gordon H. Telfer

INVENTOR

Thorndike C. T. New

BY

Frederick Shapoe

ATTORNEY

United States Patent Office 3,210,563
Patented Oct. 5, 1965

3,210,563

FOUR-LAYER SEMICONDUCTOR SWITCH WITH PARTICULAR CONFIGURATION EXHIBITING RELATIVELY HIGH TURN-OFF GAIN

Thorndike C. T. New, Hempfield Township, Westmoreland County, Pa., assignor to Westinghouse Electric Corporation, East Pittsburgh, Pa., a corporation of Pennsylvania Filed Oct. 6, 1961, Ser. No. 143,354
8 Claims. (Cl. 307—88.5)

This invention relates to a semiconductor switch and, more particularly, to a four region, three-terminal semiconductor switch which is capable of shutting off relatively large amounts of anode to cathode current by applying a pulse or a voltage between an intermediate layer and one of the outer layers.

In conventional four region PNPN or NPNP semiconductor switches, the switch may be rendered conductive by either increasing the voltage across the device so as to exceed the forward breakover voltage and thereby render the device conductive or by applying sufficient forward current between one of the intermediate base regions and the adjacent outer region rendering the device conductive. These devices can be returned from a conducting to non-conducting state by reducing the conduction current through the switch to almost zero. In conventional four region switches, however, only very small anode to cathode currents have been capable of being switched off by applying a reverse current between one of the intermediate base regions and the adjacent outer region. Hence, for all practical purposes, conventional four region semiconductor switches can only be turned off, that is, switched from conducting to non-conducting, by decreasing the anode to cathode current.

Therefore, an object of the invention is to provide a four region semiconductor switch, which can switch off relatively large anode to cathode currents by applying a current between one of the outer regions and one of the intermediate regions.

A further object of the invention is the provision of a four region semiconductor switch which can be switched from blocking to conduction or from conduction to blocking depending upon the direction of the current applied between one of the outer regions and one of the intermediate base regions.

In accordance with this invention, a three-terminal semiconductor switch is provided comprising at least four regions and three rectifying junctions with one of the outer regions (cathode-emitter) being small, i.e., of considerably smaller area than the other outer region (anode). This feature helps minimize the amplification factor $\beta_2$ between the base and collector of a three region junction transistor equivalent of which the anode is the emitter.

Furthermore, the cathode-emitter is disposed in rectifying contact with a second region (base) to form a junction having a very long perimeter and an ohmic contact (gate contact) is disposed on the base so as to be uniformly closely spaced from the perimeter of the junction. Two or more separate gate contacts may be provided which are externally connected together or a single integral contact may be used. Likewise, the emitter may comprise either an integral contact or may be of a plurality of contacts which are externally connected. The emitter comprises one or more strip portions which may be curved or linear. Each portion has a narrow width so that a current applied to the gate contact can effectively control all of the current passing through the emitter and hence in effect provides a high amplification factor $\beta_1$ between the base and collector of a three region junction transistor equivalent having the cathode as its emitter. The width of the emitter strips is preferably not greater than about 30 mils.

It has been found that in the foregoing manner, the product of $\beta_1$ and $\beta_2$ may be reduced to less than unity by a reverse current of relatively small magnitude applied to the gate contact and, hence, the device may thereby be switched off.

Other objects and advantages of the present invention will become more apparent to those skilled in the art from a reading of the following detailed description when taken in conjunction with the accompanying drawing, wherein.

Figure 1:
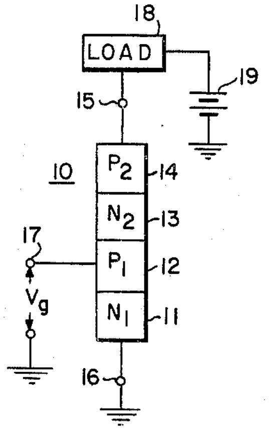
FIGURE 1 illustrates a schematic diagram of a four layer semiconductor switch.

The invention relates generally to a four region semiconductor switch such as a PNPN type or an NPNP type. A schematic diagram for a PNPN switch is shown in FIGURE 1. A four region semiconductor switch, having three terminals, an anode terminal, a cathode terminal and a gate terminal, effectively operates as two transistors of opposite conductivity type having schematic equivalents illustrated as T1 and T2 in FIG. 2. The three terminal four region device shown in FIGS. 1 and 2 comprises a semiconductor switch 10 having a first outer region 11 of an N-type conductivity material, a first inner region 12 formed of a P-type conductivity material, a second inner region 13 of an N-type conductivity material and a second outer region 14 of a P-type conductivity material. This four region device has an anode terminal 15, a cathode terminal 16 and a gate terminal 17 which is connected to the first inner base region 12.

Figure 2:
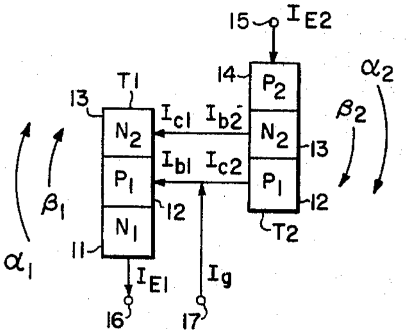
FIG. 2 illustrates an equivalent schematic diagram of a four layer semiconductor switch.

The four region device shown schematically in FIG. 1 effectively operates as two complementary transistors T1 and T2 with T1 being an NPN type and T2 a PNP type with the equivalent schematic diagram illustrated in FIG. 2. FIG. 1 illustrates the four region device connected in series with a load 18 and a direct current voltage source 19. By applying a positive voltage of sufficient magnitude to the gate terminal 17 by a signal source, $V_g$, the semiconductor switch can be rendered conductive. However, in the conventional four region device, it has not been possible to render the four region device non-conductive by applying a voltage between the gate and cathode terminals if any substantial current is flowing through the device.

As shown in FIG. 2, the second inner base region 13 functions as both the collector region for the equivalent transistor T1 and as the base region for the equivalent transistor T2. The first inner region 12 is the base region for the equivalent transistor T1 and the collector region for the equivalent transistor T2.

Alpha 1 ($\alpha_1$) illustrated in FIG. 2 is the current amplification factor of the current between emitter 11 and collector 13 of the equivalent transistor T1 whereas alpha 2 ($\alpha_2$) is the current amplification factor between emitter 14 and collector 12 of the equivalent transistor T2.

Figure 3:
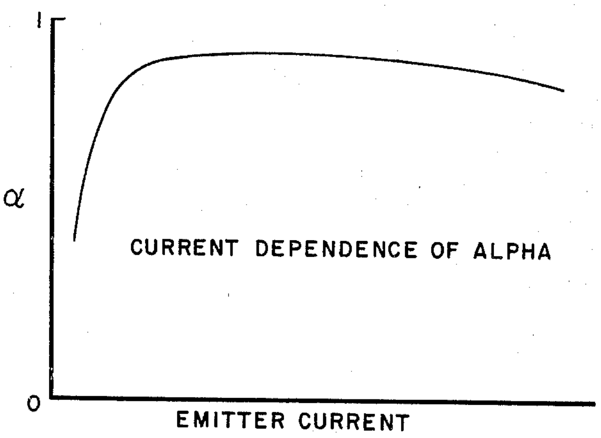
FIG. 3 is a chart useful in explaining the invention.

Likewise beta 1 ($\beta_1$) is the amplification factor of the current between the base 12 and collector 13 of the equivalent transistor T1 whereas beta 2 ($\beta_2$) is the amplification factor between the base 13 and collector 12 of the equivalent transistor T2. As is known, beta is equal to $dI_c/dI_b$ and in terms of alpha is equal to approximately $\alpha/(1-\alpha)$. In a silicon device, the amplification factor will increase with current due to saturation of traps (ref. Sab, Noyce & Shockley, Proceedings of the IRE, v. 45, p. 1228, Sept. 1957) until it is decreased by very high injection rate. A typical curve showing $\alpha$ as a function of emitter current is given in FIG. 3.

When a positive signal is applied between the gate terminal 17 and terminal 16, the gate current $I_g$ is increased to thereby increase the base current $I_{b1}$ of the first transistor T1. The collector current $I_{c1}$ of the equivalent transistor T1 is then equal to $\beta_1 \times I_{b1} \cdot I_{c1}$ is the same as the base current of the equivalent transistor T2, $I_{b2}$, which in turn causes the collector curent $I_{c2}$, of the equivalent transistor T2 to increase to $\beta_2 \times I_{b2}$. While both betas are functions of current and increase rapidly until the product of $\beta_1 \times \beta_2$ becomes greater than one, the operation of the switch is self-sustained and the conduction current can be amplified indefinitely. The current is then limited by total circuit impedance only. When this condition occurs, the switch is said to be turned on or conductive.

In the absence of the gate current, the current through the device $$I = I_{E2} = I_{E1}$$

is divided between $I_{c1}$ and $I_{c2}$ (or $I_{b2}$ and $I_{b1}$) in proportion to $\beta_1$ and $\beta_2$. If a negative or reverse current is now applied to the gate 17, $I_{c2}$ will flow into the external circuit instead of serving as $I_{b1}$. In such a state, the base current of the first equivalent transistor T1, $I_{b1}$, will be decreased or interrupted and its emitter current will also be reduced. This, in turn, can reduce the amplification factor $\beta_1$. The same effect, then, carries into the second equivalent transistor T2 and reduces $\beta_2$, etc. If a sufficient amount of the collector current of the second equivalent transistor T2, $I_{c2}$, is diverted to the external circuit, so as to sufficiently decrease $I_{b1}$ and $I_{c1}$, or $I_{b2}$, to result in relatively low $\beta_1$ and $\beta_2$, the product of $\beta_1$ and $\beta_2$ can be reduced to less than one so as to switch the device from conducting or on state to non-conducting or the off state.

The ratio of conduction current I to the reversed gate current needed to successfully interrupt the conduction current is termed turn-off gain. For a high turn-off gain it is necessary to require a small gate current and hence, a small $I_{c2}$. As stated previously, the division of the conduction current I or $I_{E2}$ into $I_{c2}$ or $I_{b1}$ is proportional to $\beta_1$. Therefore, the switch off gain can be made as good as $\beta_1$. However, it is also necessary to maintain $\beta_2$ at about $1/\beta_1$ so that the loop amplification may be easily lowered to less than 1.

Before turning off the switch, the current level is very high. The $\beta_1$ of the equivalent transistor T1, should be the effective transistor gain at high current level available at the external base electrode. In the conventional four layer switch, the externally available high current gain of this section is low.

Hence a conventional device of a four layer or four region type is difficult to turn off when any substantial current is flowing. Furthermore, due to the physical size of the anode P-type region, the current density is similar to that in the cathode N-type region thereby $\beta_2$ is high so that the product of $\beta_1$ and $\beta_2$ cannot easily be reduced to less than one so as to shut off the four layer three terminal device.

In the present invention, however, the configuration of the four region device is such that reverse gate current can be applied to the gate to shut off a relatively large anode to cathode current and more specifically, tests were made on such a device whereby a relatively smaller gate current shut off over 20 amperes in anode to cathode current of the four region switch.

Figure 4:
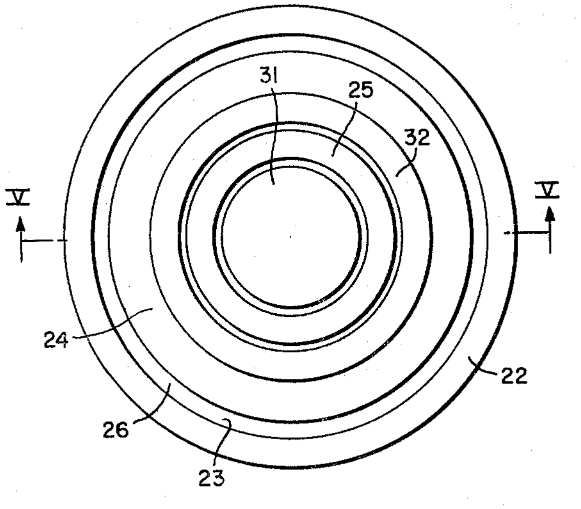
FIG. 4 illustrates a plan view of a device in accordance with this invention.
Figure 5:
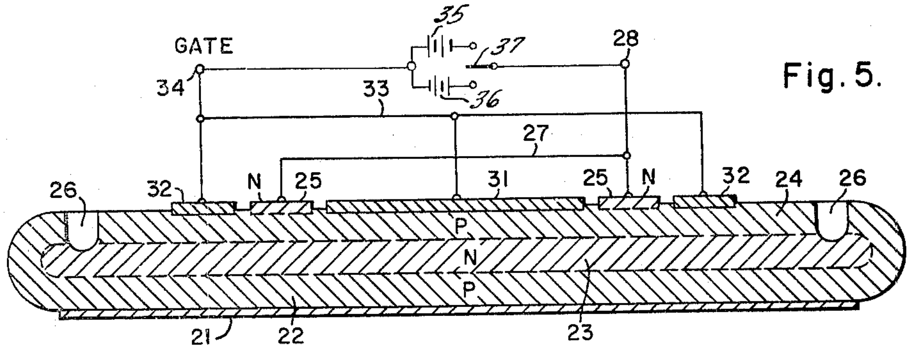
FIG. 5 illustrates a sectional view taken along the line V—V of the device illustrated in FIG. 4 including associated circuitry for the application of gate signals.

FIG. 4 illustrates a plan view of an embodiment of the invention and FIG. 5 illustrates a cross section elevation view of the device taken along V—V of FIG. 4. The device as shown in FIGS. 4 and 5 comprises an ohmic heavily doped contact 21 to form an ohmic contact with a diffused P region 22. The diffused P region 22 is circular in shape and has an upwardly curved rim as shown in FIG. 5 extending to the groove 26. Extending between and fitting into the curved upwardly extending outer rim of the P region 22 is a circular N region 23. A P-type diffused layer 24 forms a diffused junction with the N layer 23 and is circular in shape. This P region forms the control region for the four layer device with its equivalent region shown in FIGS. 1 and 2 illustrated by numeral 12. Current applied to this region will switch the device on and off or from non-conducting to conducting and conducting to non-conducting.

To switch the device on and off, the gate current is applied between the P layer 24 and an outer N layer 25 which forms an alloyed rectifying contact with the P layer 24. The annular or circular N-type cathode emitter 25 has two diametrically opposite leads connected to a conductor 27 having a terminal 28 for conducting the turn on or shut off gate current. To provide for an electrical connection to the inner base region 24, two gate contact members 31 and 32 are employed. The contact member 31, as shown in FIGS. 4 and 5, is a P-type circular disc 31 which is inside and symmetrical with the emitter ring 25. The outer periphery of the contact member 31 is symmetrical with the inner circular periphery of the emitter 25 and is closely and uniformly spaced threfrom. The outer contact member 32 is annular in shape having an inner periphery which is symmetrical with and uniformly spaced from the outer periphery of the emitter 25. Both the contact members 31 and 32 form ohmic nonrectifying contacts with the inner base member 24, so as to provide electrical termination. The members 31 and 32 are connected to a conductor 33 having a terminal 34 so that turn-on and turn-off current can be applied between terminals 28 and 34 by oppositely poled sources 35 and 36, respectively. Switch 37 is shown for connecting terminal 28 to the proper source. For clarity, the leads and terminals 27, 28, 33 and 34 are not shown in FIG. 4.

By employing an inner contact member and outer contact member closely spaced and symmetrical with the emitter 25, the effective periphery length of the emitter (or cathode here) is maximized. Furthermore, the effect of the resistivity of the base region 24 is minimized to avoid undue losses in the region by reason of the close spacing between emitter 25 and gate contacts 31 and 32 which is preferably no more than about .005 in. The width of the N-type emitter 25 is also selected so that the entire area under the emitter is effectively controlled by the gate contacts 31 and 32. The relative size of the anode 22 (or P-type emitter of equivalent transistor T2) is much larger than the cathode emitter 25, making current amplification factor $\beta_2$ small. Consequently, by such a configuration, current can be applied between the terminals 28 and 34 so as to shut off a relatively large amount of anode to cathode current going through the device. Previously, it was possible only to shut off relatively small anode to cathode current by applying a voltage or current between the emitter and base of a four layer device. An incidental advantage achieved by the relatively high turn-off gain is that the breakover characteristic will not be as greatly affected at high temperatures, hence permitting operation at higher temperatures than prior devices.

It is also the case that the current amplification factor $\beta_2$ may also be kept low by the lower N-type region 23 having a relatively large thickness, that is, appreciably larger than that of the upper P-type region 24. The preferred thickness of the region 23 is about 0.005 inch while that of region 24 is only about .002 or less.

Regarding the relative areas of the anode 22 and cathode 25, it is desirable that the difference be by a large factor. Considerable improvement in turn off characteristics can be achieved where the cathode area is smaller by a factor of at least two than that of the anode.

For effective control of the emitter current, the emitter 25 must be in a configuration so that each part of the emitter junction can be effectively controlled by the gate. A narrow strip preferably having a width of not greater than about 50 mils is a suitable form but the shape in which the strip or strips are arranged is relatively immaterial. Furthermore, a dot emitter having a diameter of less than about 30 mils would be suitable so long as the junction periphery is sufficient. There is no necessity that the gate contact be similarly narrow for good turn off characteristics. However, for efficient utilization of the crystal surface area, it too may have narrow dimensions corresponding to those of the emitter so that the gate and emitter contacts fit together in an involved manner.

The necessary length of the emitter base junction in order to effect turn off by application of a reverse current to the gate depends upon the magnitude of the current passing from anode to cathode in the device. The greater the total current, the greater the peripheral dimension should be. It has been found that about 0.01 to about 0.5 inch of junction perimeter are adequate per ampere of current.

An example of a specific device made in accordance with this invention will now be given. This device corresponds in configuration to that of FIGS. 4 and 5. N-type silicon of about 20 ohms-cm. was ground, cut and lapped to form an approximately .009 to .010 inch thick wafer with an outer diameter of .450 inch. It was then cleaned, etched and diffused with P-type aluminum (at 1200° C. for 64 hours) in the conventional manner to form a P region that becomes regions 22 and 24 after groove 26 is etched. The surface concentration of impurity atoms was in the range of 2 to $5\times10^{16}$ cm.$^{-3}$ with a junction depth of about .002 inch. The emitter ring 25, gate disc 31, gate ring 32 and contact 21 were stacked on the diffused wafer. The dimensions and compositions of these elements were as follows, where the compositions indicated are the constituents of the alloys and the semiconductivity type and approximate impurity concentration of the recrystallized regions after fusion:

| | Outside Diameter (inches) | Inside Diameter (inches) | Composition |
|---|---|---|---|
| Emitter Ring 25 | .210 | .150 | Au-Sb (N) $10^{19}$ A/CC. |
| Gate Disc 31 | .138 | | Au-B (P) $10^{19}$ A/CC. |
| Gate Ring 32 | .232 | .221 | Au-B (P) $10^{19}$ A/CC. |
| Contact 21 | .440 | | Au-B (P) $10^{19}$ A/CC. |

The thickness of emitter ring 25 was about .001 inch as were disc 31 and ring 32. Rings 25 and 32 and disc 31 were placed concentric with the disc 21. The stack was assembled and fused in a vacuum atmosphere at a peak temperature of about 700° C. The fused unit was then masked with wax and scribed near the periphery in the desired location of groove 26 to expose the diffused silicon surface for etching. This was done to break up the P diffused layer into the NPNP structure. The groove 26 was concentric with the disc 21 having a depth of .004 inch, an outer diameter of .420 inch and an inner diameter of .380 inch. The basic unit was then hard soldered onto a base (not shown) and the leads attached.

Figure 6:
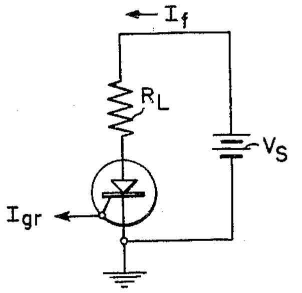
FIG. 6 is a circuit diagram of the circuit used in testing devices made in accordance with this invention.
Figure 7:
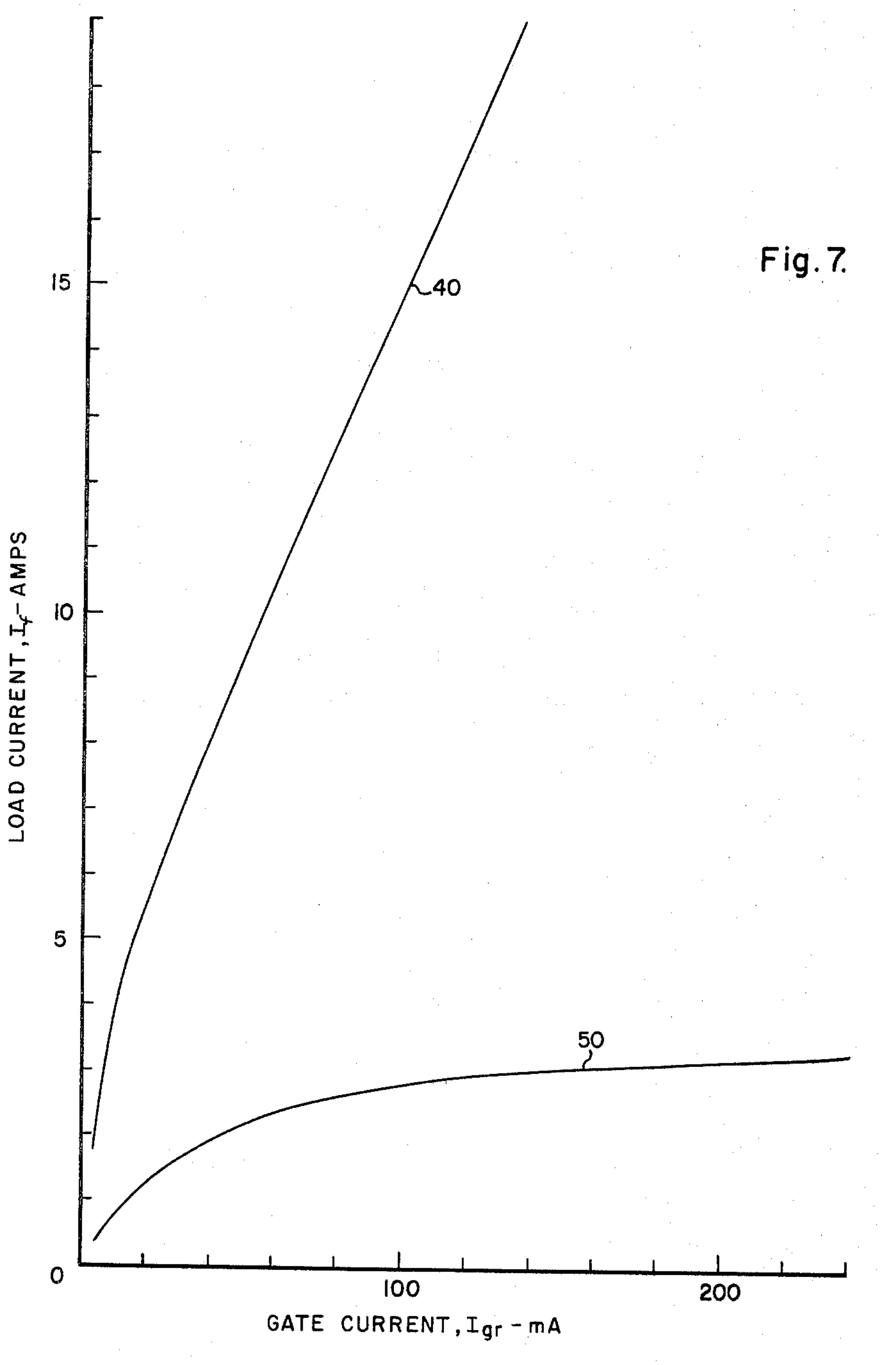
FIG. 7 is a pair of curves resulting from tests made with the circuit of FIG. 6.

The above constructed device was tested in a circuit like that shown in FIG. 6 with results as shown in the graph of FIG. 7. $V_S$ is the source voltage which was 8 volts D.C. $I_f$ is the load current (corresponding to $I_{E2}$ in the previous discussion). $R_L$ is the load resistance. $I_{gr}$ is the reverse gate current which turned off the device.

Curve 40 of FIG. 7 shows the results with the device as just described, indicating its high turn-off gain. Curve 50 shows the results of similar tests made with an NPNP switch like that disclosed in Patent 2,980,832 by F. Stein and E. Torok.

It is to be understood that devices made in accordance with this invention may take other forms than that just described. The semiconductivity type of the regions may be reversed from that shown. The semiconductive material need not be silicon but may be germanium, a III–V compound, a II–VI compound or others as permitted by materials technology. Similarly, the doping impurities may be other donor and acceptor type materials besides those specifically disclosed. Furthermore, there may be employed p-n-p-m or n-p-n-m structures as disclosed in copending application Ser. No. 649,038, filed Mar. 28, 1957, by J. Philips, now Patent No. 3,141,119, issued July 14, 1964, and assigned to the same assignee as the present invention. Structures which include an intrinsic layer (such as n-p-i-n-p) are also believed suitable.

It should be recognized that the emitter 25 and gate contacts 31 and 32 need not be in the specific configuration shown. Many other geometrical configurations can also provide a large emitter to gate contact peripheral exposure with a close spacing between emitter and each gate contact as well as small emitter (cathode) dimensions.

Figure 8:
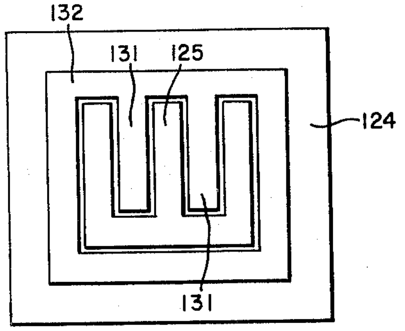
FIG. 8 is a plan view of an alternative form of the present invention.

For example in FIG. 8 one alternative is shown. The upper region 124 of a rectangular wafer, which has been processed to form three regions of alternate semiconductivity type, has a gate contact 132 enclosing an emitter 125. Portions 131 of the contact 132 extend within and are enclosed on three sides by portions of the emitter 125. In this way a long and close gap between the two can be achieved.

Although the invention has been shown and described in connection with specific embodiments, it will be apparent to those skilled in the art that there are changes in material, form and arrangements in parts which can be made to suit particular requirements without departing from the spirit and scope of the invention.

I claim as my invention:

1. A semiconductor switch comprising a semiconductor member having four regions of alternate P-type and N-type conductivity material to form a first outer region, a first inner region, a second inner region and a second outer region joined seriatim, said first outer region having an opening therein, a first electrical contact means providing an electrical contact with said first inner region spaced from said first outer region but within said opening, a second electrical contact means providing an electrical contact with said first inner region exterior of said first outer region, and means directly connecting said first and second electrical contact means.

2. A semiconductor switch comprising a semiconductor member having four regions of alternate P-type and N-type conductivity material to form a first outer region, a first inner region, a second inner region and a second outer region joined seriatim, first electrical contact means providing an electrical contact with said first inner region at a first contact point within said first outer region, second electrical contact means providing electrical contact with said first inner region at points spaced from the periphery of said first outer region, and means for providing direct electrical connection between said first and second electrical contact means.

3. A semiconductor switch comprising a semiconductor member having four regions of alternate P-type and N-type conductivity material to form a first outer region, a first inner region, a second inner region and a second outer region joined seriatim, the junction between said first outer region and said first inner region having an outer perimeter which defines an outer closed loop and an inner perimeter which defines an inner closed loop, a first electrical contact means providing an inner electrical contact on said first inner region within said inner closed loop, a second electrical contact means providing an outer electrical contact with said first inner region, said outer electrical contact defining a closed loop uniformly spaced from said outer closed loop and a conductive member electrically connecting said first and said second electrical contact means.

4. A semiconductor switch comprising a semiconductor member having four regions of alternate P-type and N-type conductivity material to form a first outer region, a first inner region, a second inner region and a second outer region joined seriatim, the junction of said first outer region and said first inner region having an outer perimeter which defines an outer closed loop and an inner perimeter which defines an inner closed loop, an inner electrical contact on said first inner region within said inner closed loop, an outer electrical contact on said first inner region defining a loop spaced outwardly and uniformly from said outer closed loop, and a conductive member electrically connecting said inner electrical contact and said outer electrical contact.

5. A semiconductor switch comprising: a body of semiconductor material having at least four regions including a first region in contact with a second region and forming a first P-N junction therewith; a fourth region separated from said second region by a third region of the same semiconductivity type as said first region; said first P-N junction having a relatively large perimeter while being appreciably smaller in area than the junction between said third and fourth regions; gate contact means comprising at least one ohmic contact on the same surface of said second region as that having said first P-N junction thereon disposed uniformly close to substantially all of the perimeter of said P-N junction, said gate contact means having direct electrical connection between all parts thereof.

6. A semiconductor switch comprising: four regions including a first region in contact with a second region and forming a first P-N junction therewith; a fourth region separated from said second region by a third region of the same semiconductivity type as said first region; said first P-N junction having a geometrical configuration of at least one strip having a width of about 50 mils or less to give said junction a relatively large perimeter while being appreciably smaller in area than the junction between said third and fourth regions; gate contact means comprising at least one ohmic contact on the surface of said second region having said first P-N junction thereon disposed a uniform distance of no more than about .005 inch from substantially all of the perimeter of said P-N junction, said gate contact means having direct electrical connection between all parts thereof.

7. A seconductor switch comprising: at least four regions including a semiconductive cathode in contact with a first semiconductive base and forming a first P-N junction therewith, an anode separated from said first base and in contact with a second semiconductive base region of the same semiconductivity type as said cathode, said second base region having a thickness appreciably greater than that of said first base region; said first P-N junction comprising at least one strip having a width of about 50 mils or less so as to give said P-N junction a relatively large perimeter while having an area about half or less the side of the junction between said anode and said second base; gate contact means comprising at least one ohmic contact on the surface of said first base having said first P-N junction thereon disposed a uniform distance of no more than about .005 inch away from substantially all of the perimeter of said P-N junction, said gate contact means having direct electrical connection between all parts thereof.

8. A semiconductive switch comprising: four united regions including a semiconductive cathode region in contact with a first semiconductive base region and forming a first P-N junction therewith, an anode region separated from said first base region by a second semiconductive base region of the same semiconductivity type as said cathode, said second base region having a thickness appreciably greater than that of said first base region; said cathode having a geometrical configuration of at least one strip having a width of about 50 mils or less to give said first P-N junction a relatively large perimeter while being not greater than about half the area of the junction between said anode and said second base region; gate contact means comprising at least one ohmic contact on the surface of said first base having said first P-N junction thereon disposed a uniform distance of no more than about .005 inch from substantially all of the perimeter of said first P-N junction, said gate contact means having direct electrical connection between all parts thereof; a current source for supplying direct current of a given magnitude between said anode and said cathode, said first P-N junction having a perimeter of from about 0.01 to about 0.5 inch per ampere of said current of given magnitude; means to apply a forward current between said gate contact means and said cathode to make said switch conductive; and means for applying a reverse current between said gate contact means and said cathode, said reverse current being of the same order of magnitude as said forward current and sufficient to put said switch in the non-conductive state.

References Cited by the Examiner

UNITED STATES PATENTS

| | | | |
|---|---|---|---|
| 2,877,359 | 3/59 | Ross | 307—88.5 |
| 2,980,832 | 4/61 | Stein et al. | 317—235 |
| 2,998,534 | 8/61 | Pomerantz | 317—235 |
| 3,040,270 | 6/62 | Gutzwiller | 307—88.5 |
| 3,097,335 | 7/63 | Schmidt | 317—235 |

OTHER REFERENCES

"Applications and Circuit Design Notes," Solid State Products, Inc., Bulletin D410-01, July 1959.

IRE Transactions on Electron Devices, January 1959, pp. 28 to 35, "Germanium P-N-P-N Switches," by I. A. Lesk.

ARTHUR GAUSS, *Primary Examiner.*

JOHN W. HUCKERT, *Examiner.*